United States Patent
Hando et al.

(10) Patent No.: US 8,143,534 B2
(45) Date of Patent: Mar. 27, 2012

(54) WIRING BOARD HAVING SOLDER BUMP AND METHOD FOR MANUFACTURING THE SAME

(75) Inventors: Takuya Hando, Inuyama (JP); Hajime Saiki, Konan (JP); Kazutaka Tanaka, Ogaki (JP)

(73) Assignee: NGK Spark Plug Co., Ltd., Nagoya (JP)

( * ) Notice: Subject to any disclaimer, the term of this patent is extended or adjusted under 35 U.S.C. 154(b) by 352 days.

(21) Appl. No.: 12/405,536

(22) Filed: Mar. 17, 2009

(65) Prior Publication Data
US 2009/0229861 A1    Sep. 17, 2009

(30) Foreign Application Priority Data

Mar. 17, 2008   (JP) ................................ 2008-068593

(51) Int. Cl.
*H05K 1/11*   (2006.01)
(52) U.S. Cl. ........ 174/263; 174/262; 361/760; 361/780; 361/783
(58) Field of Classification Search .......... 174/260–266, 174/259; 361/760, 767, 780, 783, 748, 717, 361/764, 820
See application file for complete search history.

(56) References Cited

U.S. PATENT DOCUMENTS

| | | | |
|---|---|---|---|
| 6,109,507 A * | 8/2000 | Yagi et al. | 427/97.2 |
| 6,217,987 B1 * | 4/2001 | Ono et al. | 428/209 |
| 6,660,944 B1 * | 12/2003 | Inaishi et al. | 174/261 |
| 6,828,510 B1 * | 12/2004 | Asai et al. | 174/255 |
| 2003/0019917 A1 * | 1/2003 | Furuno et al. | 228/246 |
| 2004/0140561 A1 * | 7/2004 | Suzuki | 257/737 |
| 2006/0163740 A1 * | 7/2006 | Ohno et al. | 257/762 |
| 2007/0234563 A1 * | 10/2007 | Sakaguchi et al. | 29/843 |
| 2008/0173477 A1 * | 7/2008 | Imamura et al. | 174/534 |
| 2008/0302560 A1 | 12/2008 | Tanno et al. | |

FOREIGN PATENT DOCUMENTS
WO    2007/086551 A1    8/2007

OTHER PUBLICATIONS
JPO, Office Action in the corresponding Japanese patent application No. 2008-068593, mailed on Sep. 27, 2011.

* cited by examiner

*Primary Examiner* — Hoa C Nguyen
(74) *Attorney, Agent, or Firm* — Stites & Harbison PLLC; Jeffrey A. Haeberlin (57) ABSTRACT

A wiring board has a wiring board main body, a solder resist and solder bumps. The solder resist is formed on a top surface of the wiring board main body, and includes first openings, and second openings that have a diameter larger than that of the first openings. The solder bumps are disposed in the first openings and in the second openings. In addition, top portions of the solder bumps disposed in the first openings have a flat face, while top portions of the solder bumps disposed in the second openings have a non-flat face.

4 Claims, 6 Drawing Sheets

WIRING BOARD HAVING SOLDER BUMP AND METHOD FOR MANUFACTURING THE SAME

CROSS-REFERENCE TO RELATED APPLICATIONS

This application is based on and claims priority to Japanese Patent Application No. 2008-68593, filed Mar. 17, 2008, which is hereby incorporated by reference in its entirety.

BACKGROUND OF THE INVENTION

1. Field of the Invention

The present invention relates to a wiring board having solder bumps therein and to a method for manufacturing the same.

2. Description of Related Art

A conventional wiring board (semiconductor package) has solder bumps formed on pads that are used for mounting an electronic component. Such wiring board includes various types, such as a ball grid array (BGA) and a pin grid array (PGA). On these wiring boards, an electronic component is mounted by flip chip connection in high density through the solder bumps. In addition, the solder bumps are formed by, for example, printing, solder balls or the like. The printing method is a method for forming solder bumps by reflow after printing soldering paste on pads that are formed on a top surface of the wiring board using a metal mask with a plurality of openings. The solder ball method is a method for forming solder bumps by reflow after providing the solder balls on the pads. In addition, in this type of wiring board, a solder resist is formed so as to cover the top surface of the wiring board. The solder resist is provided with a plurality of openings to which the pads are exposed.

Although a diameter of each opening in the solder resist is the same, it might be different depending on a specification of the wiring board. In the printing method, a diameter of an opening of the metal mask can be altered according to the opening of the solder resist to form the solder bumps. However, since the printing method has a disadvantage that the formation of solder bumps is difficult when a pitch between the solder bumps is narrow, the various conventional technologies suggest the solder ball method (e.g., refer to Japanese Patent Application Laid-Open (kokai) No. 2007-281369 (FIGS. 2A to 2K etc.) (the "'369 application")). In the conventional technology according to the '369 application, a solder resist in which first openings and second openings having a diameter larger than that of the first openings are formed. First solder balls are disposed in the first openings and second solder balls with particle size larger than that of the first solder ball are disposed in the second openings.

However, the conventional technology according to the '369 application requires a process to position first solder balls in first openings while a first mask covering second openings is disposed on a solder resist, and a process to position second solder balls in second openings while a second mask covering the first openings is disposed on the solder resist. As a result, the number of the required loads for forming the solder bumps increases, thereby raising manufacturing costs of the wiring board. Further, the conventional technology according to the '369 application uses two types of solder balls each having a different diameter so as to correspond to two types of openings of the solder resist, each of which has a different diameter. In this respect, variations arise in the height of each solder bump. As a result, a faulty connection is likely to occur between a wiring board and an electronic component.

BRIEF SUMMARY OF THE INVENTION

The present invention is accomplished in light of the above-mentioned problems, and a first object of the present invention is to provide a wiring board having solder bumps capable of improving connection reliability with other components. A second object of the present invention is to provide a method for manufacturing the wiring board with solder bumps capable of improving connection reliability with other components and reducing the number of required load for forming the solder bumps.

According to a first aspect of the invention, a wiring board includes: a wiring board main body having a top surface; a metal layer formed on the top surface of the wiring board main body; a solder resist formed at least on the metal layer and including therein a plurality of openings of different diameters in which the metal layer is exposed; and a plurality of solder bumps disposed on the metal layer in the plurality of openings. The plurality of openings includes a first opening and a second opening having a diameter larger than that of the first opening. A top portion of a solder bump disposed in the first opening has a flat face. A top portion of a solder bump disposed in the second opening has either a flat face with an area smaller than that of the flat face of the top portion of the solder bump disposed in the first opening, or a non-flat face.

Since the diameter of the first opening is smaller than that of the second opening in the wiring board according to the first aspect, a volume of a portion in the solder bump which projects from an opening edge of the first opening is greater than that of a portion in the solder bump which projects from an opening edge of the second opening. As a result, a height of the solder bump disposed in the first opening is likely to be higher than that of the solder bump disposed in the second opening. In this respect, variation in the height of each solder bump arises whereby a faulty connection may occur between the solder bump and other components.

Thus, in the wiring board according to the first aspect, the top portion of the solder bump disposed in the second opening has either the flat face with the area smaller than that of the flat face of the top portion of the solder bump disposed in the first opening, or a non-flat face. That is, the higher solder bump (the solder bump disposed in the first opening) is flattened in greater degree than the lower solder bump (the solder bump disposed in the second opening). Even though the solder resist has the plurality of openings with different diameters, the height of each solder bump can be aligned whereby the connection reliability between the solder bumps and other components can be improved.

A substrate (wiring board main body) constituting the wiring board according to the present invention can be a substrate mainly made of resin material or ceramic material. As specific examples of the resin substrate, there are EP resin (epoxy resin) boards, PI resin (polyimide resin) boards, BT resin (bismaleimide triazine resin) boards, PPE resin (polyphenylene ether resin) boards, or the like. In addition, it is possible to use a subsrate which consists of a composite material made of these resin and glass fibers (a glass woven fabric and a glass nonwoven fabric) or organic fibers, such as polyamide fibers. Alternatively, a substrate or the like made of a resin-resin composite material may be used, which is formed by way of impregnating a thermosetting resin, such as an epoxy resin, with a three-dimensional meshes-like fluororesin base material, such as a continuous porous PTFE. Specific examples of the ceramic substrate include a substrate which consists of alumina, aluminum nitride, boron nitride, silicon carbide, and silicon nitride.

The solder resist is made of resin having insulation properties and heat resistance and functions as a protective layer protecting the wiring board main body by covering the wiring board main body. An example of the solder resist includes a solder resist made of epoxy resin, polyimide resin or the like.

The cross-sectional shape of the plurality of openings formed in the solder resist can be selected from circular, oval, triangular, rectangular and square shape or the like. As used herein, the "diameter" of the opening means a maximum length of an inner diameter of the opening (maximum diameter). For example, when the opening assumes a rectangular shape in the cross-section, the diameter is deemed to be a length of a diagonal line of the rectangle. Also, when the opening assumes an oval shape in the cross-section, the diameter is deemed to be a length of a major axis of the oval. Further, when the opening assumes a corn shape where the opening made gradually wider toward a top surface edge portion from a rear surface edge portion of the solder resist, the "diameter" of the opening is deemed to be a maximum length (maximum diameter) of the diameter at the rear surface edge portion.

A material of the solder bump may be suitably selected, considering a material of the connection terminal or the like of a component to be mounted. However, the suitable material can be cited from a Pb—Sn system solder including 90Pb-10Sn, 95Pb-5Sn and 40Pb-60Sn or the like, a Sn—Sb system solder, a Sn—Ag system solder, a Sn—Ag—Cu system solder, an Au—Ge system solder, an Au—Sn system solder, an Au—Si system solder, or the like. Particularly, the plurality of solder bumps is preferably made of lead-free solder. In this way, the solder bump does not contain lead, thereby reducing pressure on the environment. Further, the lead-free solder has worse wettability than that of the solder containing lead and tends to cause void. Thus, when the flux is made easily release by roughening the top portion of the solder bump, it is possible to effectively prevent a development of the void. Examples of the lead-free solder include an Sn—Sb system solder, an Sn—Ag system solder, an Sn—Ag—Cu system solder, an Au—Ge system solder, an Au—Sn system solder, an Au—Si system solder, or the like.

Further, the volume of the solder bump disposed in the first opening is preferably equal to that of the solder bump disposed in the second opening. In this way, since the solder bumps disposed in the first opening and in the second opening can be produced by the same material, it is possible to reduce a manufacturing cost of the wiring board.

Furthermore, a coplanarity measurement of the top portion of the solder bump disposed in the first opening is preferably 10 micrometers or less per 1 $cm^2$. In this way, the solder bumps and other components can be assuredly and readily connected. For example, when the coplanarity measurement is larger than 10 micrometers per 1 $cm^2$, the height of each solder bump may vary whereby a faulty connection with other components is likely to occur.

Further, at least the top portion of the solder bump disposed in the first opening is preferably roughened, and the roughened top portion preferably has a surface roughness Ra of 0.3 micrometers or more to 5 micrometers or less. In this way, when heating and melting the flux contained in the solder bumps, the flux is vaporized and assuredly released to the outside from the top portion. Therefore, it is possible to prevent a development of the void resulting from the vaporized flux retaining in the solder bumps. When the surface roughness Ra is less than 0.3 micrometer, the vaporized flux tends to retain in the solder bumps and causes the void. On the other hand, when the surface roughness Ra is greater than 5 micrometers, the height of each solder bump may vary, and the coplanarity measurement tends to increase. As a result, joint strength between the solder bumps and other components may deteriorate. Further, since a deep concave portion is formed in the top portion of the solder bump because the surface roughness Ra is greater than 5 micrometers, the flux retained in the concave portion is unlikely to be released to the outside.

As used herein, the "coplanarity" means a homogeneity of terminal lowermost surface defined by "a method for measuring BGA dimension according to Electronic Industries Association of Japan (EIAJ) ED-7304". Also, the "coplanarity measurement" means a measured value defined by "method for measuring BGA dimension according to ED-7304", and serves as an index which shows the homogeneity of the top portion of plural solder bumps with respect to the top surface of the wiring board main body. Further, the "surface roughness Ra" described in this specification means an arithmetic average roughness Ra defined by JIS B0601. In addition, the measuring method of surface roughness Ra shall apply to JIS B0651.

When the wiring board includes therein an electric signal path and an electric ground path or an electric power source path, generally high current flows into the electric ground path or the electric power source path rather than the signal electric path. Thus, an area of the metal layer which constitutes the electric ground path or the electric power source path is preferably larger than an area of the metal layer which constitutes the electric signal path. Further, the solder bumps disposed on the metal layer which constitutes the electric ground path or the electric power source path have preferably no void. Therefore, according to the first aspect, the metal layer exposed in the first opening and the solder bump disposed in the first opening preferably constitute the electric signal path, and the metal layer exposed in the second opening and the solder bump disposed in the second opening preferably constitute the electric ground path or the electric power source path. Furthermore, the electric signal path and the electric ground path or the electric power source path are preferably electrically independent. In this way, the metal layer constituting the electric signal path is exposed in the first opening, and the metal layer constituting the electric ground path or the electric power source path is exposed in the second opening having a diameter larger than that of the first opening. Thereby, the area of the metal layer constituting the electric ground path or the electric power source path is larger than the area of the metal layer constituting the electric signal path. Further, the top portion of the solder bump disposed on the metal layer which constitutes the electric ground path or the electric power source path has a smaller flat face than that of the top portion of the solder bump disposed in the first opening, or has a non-flat face because the solder bump is disposed in the second opening. Thus, the solder bump disposed on the metal layer which constitutes the electric ground path or the electric power source path is unlikely to have a void resulting from a flattening process. Therefore, the electric ground path or the electric power source path can be formed into a suitable structure to feed high current.

According to a second aspect of the invention, a method for manufacturing a wiring board includes: a metal layer formation step comprising forming a metal layer on a top surface of a wiring board main body; a solder resist formation step comprising forming a solder resist on the wiring board main body, the solder resist exposing the metal layer and having a plurality of openings with different diameters; a solder bump positioning step comprising disposing a plurality of elements comprising solder bump materials on the metal layer formed in the plurality of openings; a heating and melting step comprising forming a plurality of solder bumps by heating and melting the plurality of elements comprising solder bump materials after the solder bump positioning step; and a solder bump formation step for aligning a height of the plurality of solder bumps by pressing and flattening at least a part of top portions of the plurality of solder bumps after the heating and melting process.

Therefore, according to the method of the second aspect, at least a part of the top portions of the plurality of solder bumps are pressed and flattened so as to align the height of each solder bump in the solder bump forming process. Thus, although the solder resist has the plurality of openings with different diameters, connection reliability between the solder bumps and other components can be improved.

Notably, in the solder bump positioning step, a plurality of solder balls each having an identical particle size and volume is preferably disposed on the metal layer as the plurality of elements comprising solder bump materials. In this way, since the plurality of solder bumps can be formed by the same solder ball, a manufacturing cost of the wiring board can be reduced.

Further, in the solder bump formation step, at least a part of the top portions of the plurality of solder bumps are preferably flattened and roughened simultaneously using a pressing tool having a rough face. In this way, since the top portions of the plurality of solder bumps are roughened in the solder bump formation step so as to form tiny irregularities thereon, the flux tends to be retained on the top portions. The irregularities formed on the top portions of the solder bumps serve as a breathing path of the vaporized flux when the solder bumps are heated and melted. The vaporized flux passes through the breathing path and is assuredly released to the outside from the top portions. As a result, it is possible to prevent development of a void which results from the vaporized flux being retained in the solder bumps. Thus, the connection reliability between the solder bumps and other components improves. Furthermore, in the solder bump formation step, since the top portions of the solder bumps are flattened and roughened simultaneously, the wiring board having the solder bumps can be efficiently manufactured.

When conducting the solder bump formation step, the pressing tool may be heated by a heating means, such as a heater, or it may not be heated. When heating the pressing tool, the solder bump softens to some extent. Therefore, the top portion of the solder bump can be easily deformed compared to the case where the solder bumps are flattened at a normal temperature. Thus, the top portions of the solder bumps are assuredly flattened without increasing the stress of the pressing tool. On the other hand, when no heating pressing tool is employed, a structure for flattening the top portions of the solder bumps is simplified because the heating method is unnecessary.

The pressing tool is preferably made of a metal material, such as titanium and stainless steel, a ceramic material, such as metallic alumina, silicon nitride, silicon carbide, boron nitride, or a glass material or the like, all of which preferably has no solder wettability (or is unlikely to wet with solder). More particularly, the pressing tool is preferably made of ceramic material which is excellent in processing accuracy and unlikely to deform by heat. Furthermore, the roughening face of the pressing tool preferably has a flat surface. In this way, since the pressure is uniformly applied to the solder bumps, the top portion of each solder bump can be accurately made flat.

Other features and advantages of the invention will be set forth in, or apparent from, the detailed description of the exemplary embodiments of the invention found below.

DETAIL DESCRIPTION OF EXEMPLARY EMBODIMENTS OF THE INVENTION

Hereafter, an embodiment carrying out the present invention will be described in detail with reference to FIGS. 1 to 11.

Figure 1:
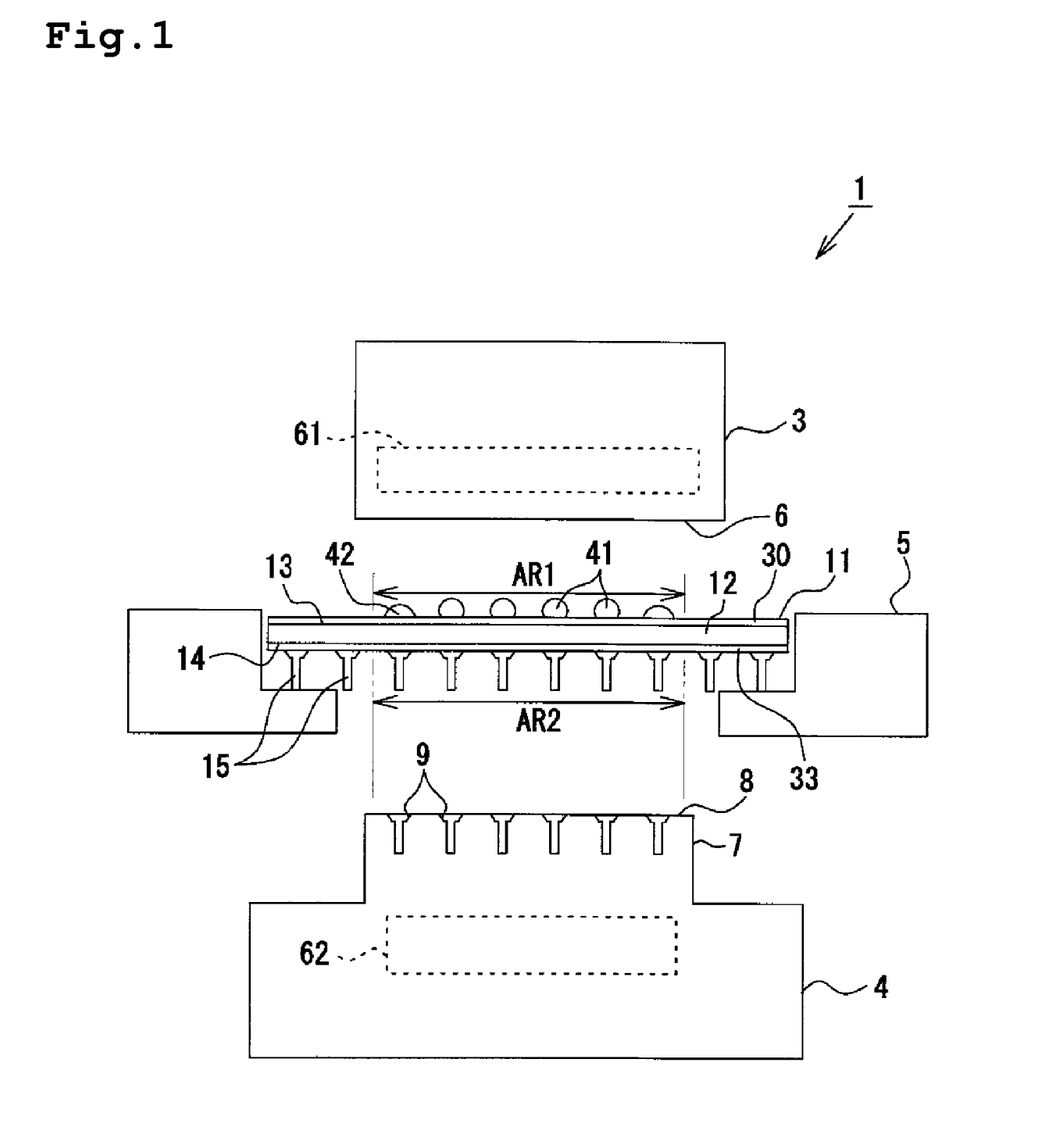
FIG. 1 is a schematic diagram showing a solder bump flattening device according to an embodiment of the invention.
Figure 2:
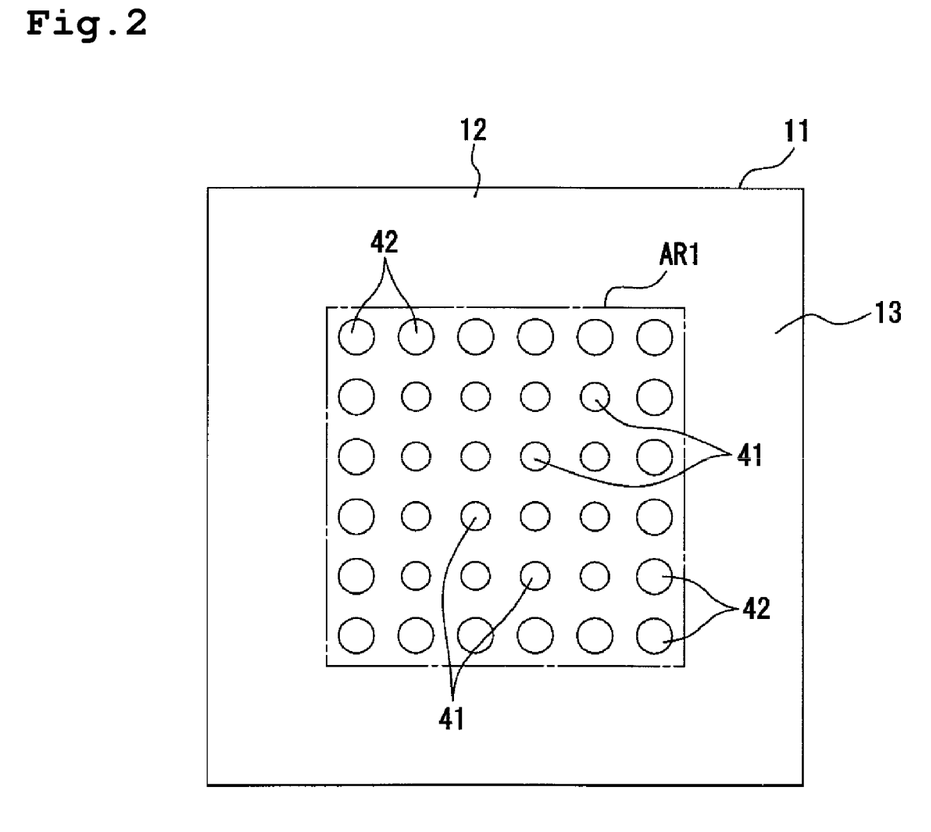
FIG. 2 is a schematic plan view showing a wiring board prior to a solder bump forming step.
Figure 3:
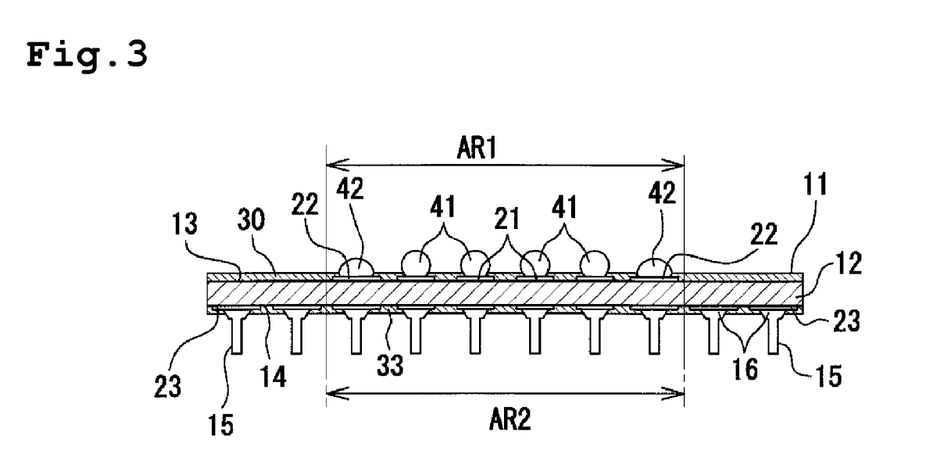
FIG. 3 is a schematic sectional view showing the wiring board prior to a solder bump forming step.

FIG. 1 is a schematic diagram of a solder bump flattening device 1. FIG. 2 is a schematic plan view of a wiring board 11 to be set in the solder bump flattening device 1, and FIG. 3 is a schematic sectional view of the wiring board 11. As shown in FIG. 1, the solder bump flattening device 1 has an upper jig 3 serving as a pressing tool and a lower jig 4 serving as a support tool and a movable jig 5 used for setting the wiring board 11 on the lower jig 4 or the like.

As shown in FIGS. 2 and 3, the wiring board 11 of this embodiment is a pin grid array (PGA) type semiconductor package which is applicable to a component with many terminals, such as MPU, through high-density flip chip bonding. More particularly, the wiring board 11 is a multilayer wiring board in which a plurality of resin insulating layers is formed by a known technique on upper and lower surfaces of a core substrate that is made of resin, such as bismaleimide triazine containing glass fibers. The multilayer wiring board is a plate-like component of about 40 mm square and 1 mm thick and is equipped with copper wirings (not illustrated) between the resin insulating layers.

A generally square region in the center of a top surface 13 (upper surface in FIG. 3) of a wiring board main body 12 that constitutes the wiring board 11 serves as a bump forming region AR1. In the bump forming region AR1, a plurality of first pads 21 and a plurality of second pads 22 are disposed in a generally lattice pattern. Each pad 21 and 22 is a metal layer comprised of a plurality of metal plating layers. Each first pad 21 is 150 micrometers in diameter and 20 micrometers in thickness, and each second pad 22 is 170 micrometers in diameter and 20 micrometers in thickness.

As shown in FIGS. 1 to 4, a solder resist 30 is formed on the top surface 13 of the wiring board main body 12 and the pads 21, 22 so as to cover the generally whole top surface 13. The solder resist 30 has a first opening 31 to which the first pad 21 is exposed and a second opening 32 to which the second pad 22 is exposed. Each opening 31 and 32 assumes a circular shape in the cross-section, and has a diameter (a diameter at a rear surface side edge portion of the solder resist 30 in this embodiment) differs between the opening 31 and the opening 32. According to this embodiment, the diameter of the first opening 31 is about 80 micrometers, and the diameter of the second opening 32 is about 100 micrometers. That is, the second opening 32 has the diameter larger than that of the first opening 31.

Figure 6:
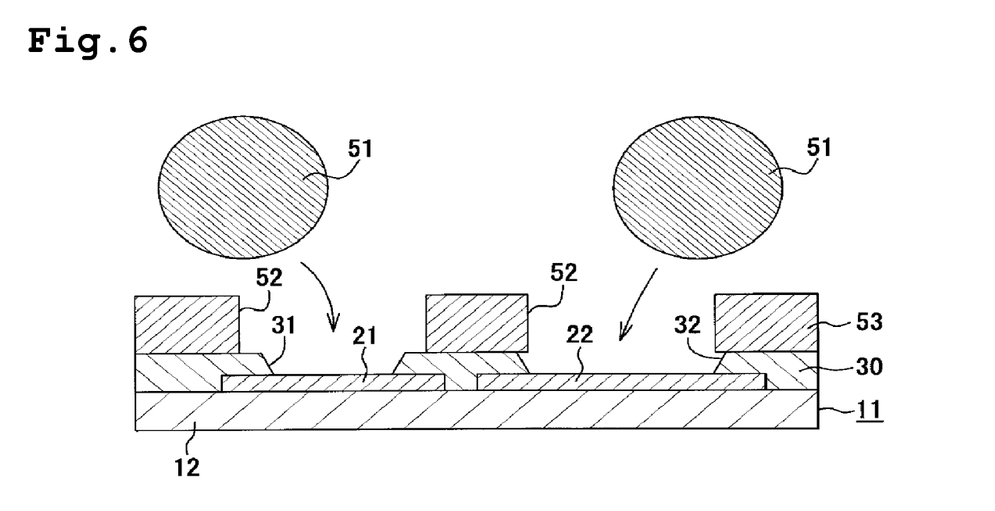
FIG. 6 is a side sectional view of a portion of a wiring board during a step of a method for manufacturing the wiring board.
Figure 7:
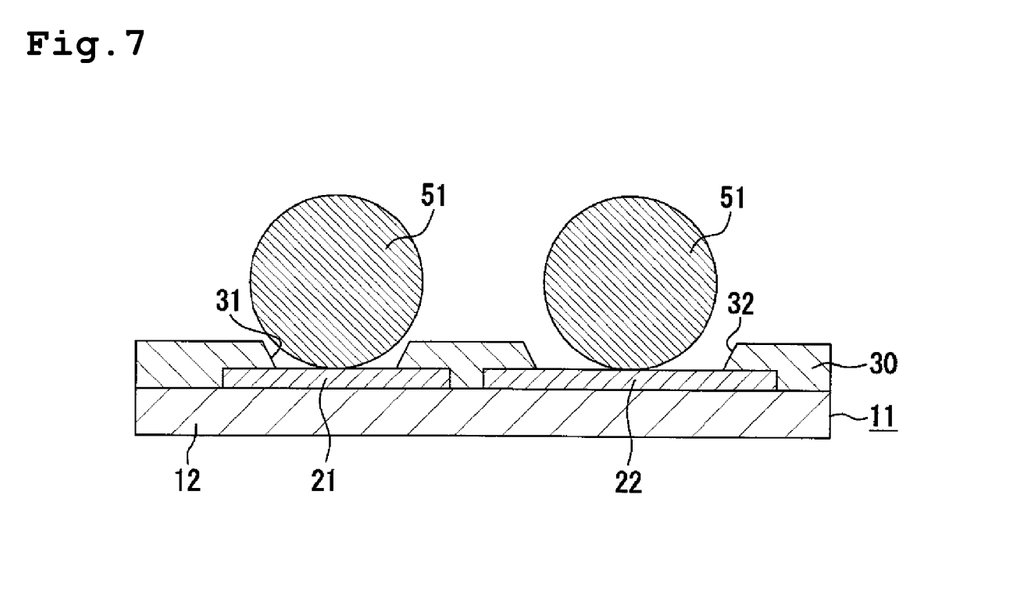
FIG. 7 is a side sectional view of a portion of a wiring board during a step of a method for manufacturing the wiring board.
Figure 8:
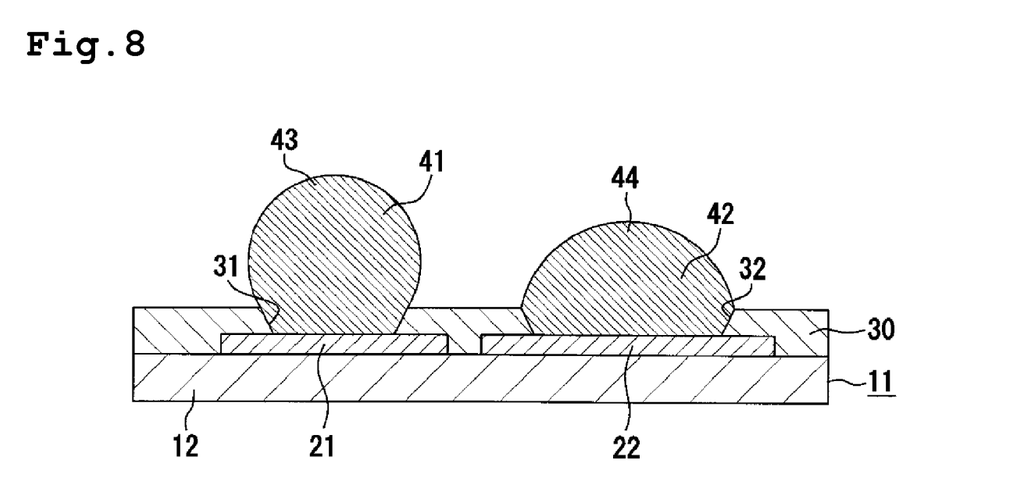
FIG. 8 is a side sectional view of a portion of a wiring board during a step of a method for manufacturing the wiring board.

In each first opening 31, a first solder bump 41 used for connecting to an IC chip 45 (refer to FIG. 9) is disposed on the surface of the first pad 21. Further, in each second opening 32, a second solder bump 42 used for connecting to the IC chip 45 is disposed on the surface of the second pad 22. The solder bumps 41, 42 according to the embodiment are made of Sn—Ag system solder, which is a lead-free solder. Furthermore, as shown in FIGS. 6 to 8, the first solder bump 41 assumes a hemispherical shape and is formed such that a solder ball 51, which is an element comprising a solder bump formation material, is disposed on the first pad 21 and then subjected to reflow. Similarly, the second solder bump 42 assumes a hemispherical shape and is formed such that the solder ball 51 the same material as the first solder bump 41 is disposed on the second pad 22 and then subjected to reflow. Therefore, the volume of the first solder bump 41 and that of the second solder bump 42 are the same.

In the embodiment, a plurality of first electrical paths comprised of the first pads 21 and the first solder bumps 41 constitutes an electric signal path, respectively. Further, a plurality of electrical paths are comprised of the second pads 22 and the second solder bumps 42, half of which constitute an electric ground path and the other half of which constitute an electric power source path. These electric paths for signal, ground and power source are electrically independent.

As shown in FIGS. 1 and 3, a plurality of pads 23 disposed in a generally lattice pattern is formed on a whole rear surface 14 (lower surface in FIG. 3) of the wiring board main body 12. Further, a solder resist 33 is formed on the rear surface 14 of the wiring board main body 12 so as to cover the generally whole rear surface 14. The solder resist 33 has a plurality of openings to which the pads 23 are exposed. A plurality of pins 15 used for connecting to a socket is joined with solder on the surface of each pad 23 in the opening. Notably, each pin 15 is joined on the rear surface 14 of the wiring board 11 with solder that has a higher melting point than that of the solder bumps 41, 42 formed on the top surface 13.

Further, each pin 15 is comprised of a circular stem portion in the cross-section and a head portion 16 having a diameter larger than that of the stem portion. The head 16 is to be soldered to the pad 23. Notably, each pin 15 is once set to a pin insertion hole (not illustrated) of the positioning jig and is joined to the wiring board 11 with a single soldering process. Therefore, the positional accuracy between the pins 15 in the wiring board 11 is relatively high.

The movable jig 5 in FIG. 1 horizontally moves along a conveyor rail (not illustrated) and also vertically moves while supporting four corners of the wiring board 11. The wiring board 11 is set to the lower jig 4 along with these horizontal and vertical movements of the movable jig 5.

The upper jig 3 is made of ceramic material (boron nitride) and has a lower face formed into a flat roughened face 6. In the embodiment, flatness of the roughened face 6 is 10 micrometers or less per 1 cm$^2$, and a surface roughness Ra thereof is 0.4 micrometer. The upper jig 3 is moved toward a lower side by a pressure device, such as an air press or a hydraulic press (not illustrated). Then, a part of the solder bumps 41, 42 (first solder bumps 41 in this embodiment) is pressed by the roughened face 6. In this way, only a top portion 43 of the first solder bump 41 is flattened in the solder bumps 41, 42, and simultaneously, a top face of the top portion 43 is roughened (refer to FIG. 4). As a result, a flat face is not formed in a top portion 44 of the second solder bump 42 while the top portion 43 of the first solder bump 41 is made flat. In other words, a flat face area of the top portion 43 of the first solder bump 41 disposed in the first opening 31 is larger than that of the top portion 44 of the second solder bump 42 disposed in the second opening 32 that has a diameter larger than that of the first opening 31. Thus, as the diameter of the opening is reduced, the flat face area of the top portion of the solder bump disposed in the opening is enlarged.

As shown in FIG. 1, the lower jig 4 has a support portion 7 at a center thereof which projects in a square pole shape. A front end face (upper end face) of the support portion 7 serves as a contact surface 8 which contacts the rear surface 14 of the wiring board main body 12. The contact surface 8 of the support portion 7 has a plurality of pin ports 9 that opens at the upper side and disposed in a lattice pattern with an equal distance therebetween.

The pin port 9 in the embodiment is defined by an opening having a cross-sectional area gradually increase toward its opening edge (upper edge) and a deep port portion having a uniform section shape and made deeper than its opening. Further, the opening of the pin port 9 has a diameter capable of accommodating the heads 16 of the pin 15, and the deep port portion has a diameter slightly larger than that of the front end of the pin 15. In addition, the support portion 7 of the lower jig 4 is preferably made of metal material having high mechanical strength (e.g., hard metal).

As shown in FIG. 1, the solder bump flattening device 1 of this embodiment has electrical heaters 61 and 62 for heating the upper jig 3 and the lower jig 4 at a predetermined temperature, respectively. The top portions 43 of the first solder bumps 41 are flattened and roughened while each jig 3, 4 is heated by the electrical heaters 61, 62, respectively.

Figure 4:
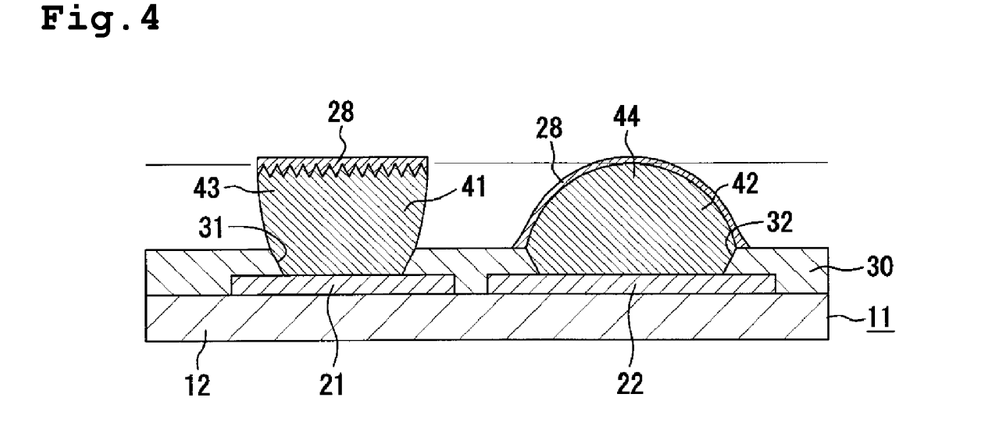
FIG. 4 is a side sectional view showing a portion of the wiring board after a solder bump forming step.
Figure 5:
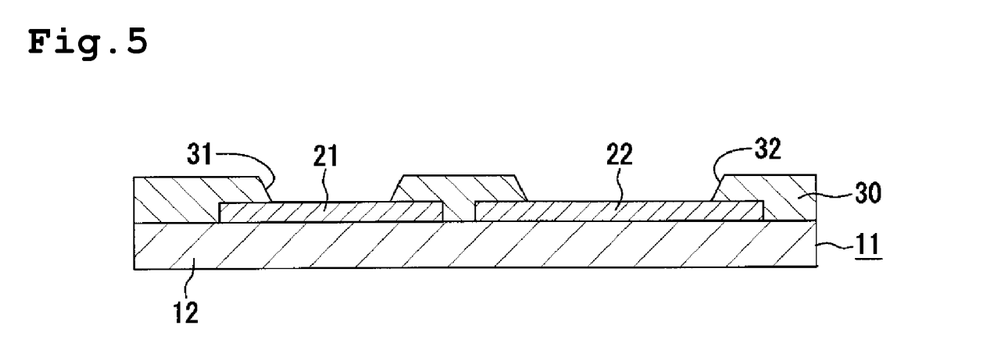
FIG. 5 is a side sectional view of a portion of a wiring board during a step of a method for manufacturing the wiring board.

In the first solder bumps 41 which are flattened and roughened as shown in FIG. 4, the distance from the top surface 13 of the wiring board main body 12 to the top portion 43 of the first solder bump 41 is set to be 30 micrometers in this embodiment. Similarly, in the second solder bumps 42 which are not flattened and roughened, the distance from the top surface 13 of the wiring board main body 12 to the top portion 44 of the second solder bump 42 is set to be 30 micrometers in this embodiment. That is, the heights of the solder bumps 41, 42 are aligned by pressing and flattening the top portion 43 of the first solder bump 41. In addition, the flat face of the top portion 43 has irregularity, and the surface roughness Ra thereof is set to be 0.4 micrometer. Furthermore, a coplanarity measurement of the top portion 43 of each first solder bump 41 is equal to a flatness of the roughened face 6 of the upper jig 3, which is set to be 10 micrometers or less per 1 cm$^2$.

In addition, the maximum diameter of the flattened and roughened first solder bumps 41 is preferably set to be 0.5 or more to 1.2 or less times of the diameter of the first pad 21. For example, when the maximum diameter of the first solder bump 41 is more than 1.2 times greater in diameter than that of the first pad 21, the solder tends to run over from the first pad 21 and come in contact with the adjoining first solder bump 41 formed on the first pad 21 or with the adjoining second solder bump 42 formed on the second pad 22 at the time of joining the first solder bumps 41 to the IC chip 45 by melting the first solder bumps 41. As a result, a short-circuit is likely to occur. On the other hand, when the maximum diameter of the first solder bump 41 is less than 0.5 times the diameter of the first pad 21, the top portion 43 of the first solder bump 41 is unlikely to reach the contact terminals 47 of the IC chip 45 in the melting process. Therefore, the first solder bump 41 is unlikely to join to the contact terminal 47. In this embodiment, since the diameter of the first pad 21 is 150 micrometers, the maximum diameter of the first solder bump 41 is preferably set to be 75 micrometer or more to 180 micrometers or less. Further, the diameter of the top portion 43 of the first solder bump 41 is preferably set to be 0.5 times, or more, to less than 1.0 times the maximum diameter of the first solder bump 41, more preferably 0.8 time or more to less than 1.0 times the maximum diameter of the first solder bump 41. For example, when the diameter of the top portion 43 is less than 0.5 times the maximum diameter of the first solder bump 41, it is difficult to retain a required amount of flux 28 for joining the IC chip 45. On the other hand, when the diameter of the top portion 43 is 1.0 times the maximum diameter of the first solder bump 41, the solder constituting the top portion 43 comes in contact with the adjoining first solder bump 41 formed on the first pad 21 or with the adjoining second solder bump 42 formed on the second pad 22 at the time of joining the first solder bumps 41 to the IC chip 45 by melting the first solder bumps 41. As a result, short-circuit is likely to occur. In this embodiment, since the maximum diameter of the first solder bump 41 is between 75 micrometers and 180 micrometers, the diameter of the top portion 43 is preferably between 37.5 micrometer and 180 micrometers.

Furthermore, the maximum diameter of the second solder bump 42, which is not flattened and roughened, is preferably 0.5 times, or more, to 1.2 times, or less, the diameter of the second pad 22. For example, when the maximum diameter of the second solder bump 42 is more than 1.2 times greater in diameter than that of the second pad 22, the solder tends to run over from the second pad 22 and come in contact with the adjoining first solder bump 41 formed on the first pad 21 or with the adjoining second solder bump 42 formed on the second pad 22 at the time of joining the second solder bumps 42 to the IC chip 45 by melting the second solder bumps 42. As a result, a short-circuit is likely to occur. On the other hand, when the second solder bump 42 has the maximum diameter of less than 0.5 times the diameter of the second pad 22, the top portion 44 of the second solder bump 42 is unlikely to reach the contact terminals 47 of the IC chip 45 in the melting process. As a result, the second solder bump 42 is unlikely to be joined to the contact terminal 47. In this embodiment, since the diameter of the second pad 22 is 170 micrometers, the maximum diameter of the second solder bump 42 is preferably set to be between 85 micrometer and 204 micrometers.

Next, a method for manufacturing the wiring board 11 according to this embodiment will be described.

The wiring board 11 is manufactured as follows. First, a resin insulating layer made of epoxy resin is formed on a core substrate. Then, a copper wiring pattern is formed on both a surface of the core substrate and a surface of the resin insulating layer by semi-additive method that uses electroless copper plating and electrolytic copper plating. In this way, the wiring board main body 12 is formed. The copper wiring pattern may be formed by a subtractive method or a full additive method.

In a subsequent metal layer formation step, an electroless Ni—P plating is conducted by a conventionally known technique, and thereafter, electroless Au plating is conducted so that the first pads 21 and the second pads 22 made of Ni—P plating layer and Au plating layer are formed in a plurality of locations on the top surface 13 of the wiring board main body 12. Similarly, with conducting the electroless Ni—P plating and electroless Au plating, the pads 23 made of Ni—P plating layer and Au plating layer are formed in a plurality of locations on the rear surface 14 of the wiring board main body 12.

In a subsequent solder resist formation step, the solder resist 30 is formed by applying and curing a photosensitive epoxy resin or the like on the top surface 13 of the wiring board main body 12. Next, exposure and development are performed in the conditions that a predetermined mask is disposed on the solder resist 30 so as to pattern the first openings 31 and the second openings 32 on the solder resist 30 (refer to FIG. 5). Further, the solder resist 33 is formed by applying and curing a photosensitive epoxy resin or the like on the rear surface 14 of the wiring board main body 12. Then, exposure and development are conducted in the conditions that a predetermined mask is disposed on the solder resist 33 so as to pattern openings in the solder resist 33.

In a solder bump formation material positioning step (or a "solder bump positioning step"), the solder balls 51 are disposed, respectively, on each pad 21, 22 in the openings 31, 32. More particularly, a ball alignment mask 53 that has a plurality of through holes 52 corresponding to each opening 31, 32 is disposed on the solder resist 30 (refer to FIG. 6). Next, the plurality of solder balls 51 each having identical particle size and volume is supplied on the ball alignment mask 53. Then, the thus-supplied solder balls 51 are dropped in each opening 31, 32 to thereby disposed on each pad 21, 22. Thereafter, the ball alignment mask 53 is removed (refer to FIG. 7).

In a subsequent heating and melting step, each solder ball 51 is heated and melted to form the first solder bump 41 and the second solder bump 42. In detail, the wiring board main body 12 where the solder balls 51 are disposed therein is placed in a reflow furnace and heated at a temperature of 10 to 40 degrees C. higher than the melting point of the solder (up to 250 degrees C. in this embodiment), and thereafter, the wiring board main body 12 is cooled down. In this way, the hemispherical solder bumps 41, 42 are disposed on the top surface 13 of the wiring board main body 12 (refer to FIG. 8). Further, the pins 15 are soldered to each pad 23 formed in the rear surface 14 of the wiring board main body 12. As a result, the wiring board 11 is completed (refer to FIGS. 1 to 3).

Next, the wiring board 11 is set to the movable jig 5 where the top surface 13 is turned upwards. The upper jig 3 and the lower jig 4 are heated at 80 degrees C. with the electrical heaters 61 and 62, respectively. Then, the movable jig 5 conveys and lifts the wiring board 11 so that the support portion 7 of the lower jig 4 supports the wiring board 11. As a result, the plurality of pins 15 disposed in a supported region AR2 (refer to FIGS. 1 and 3) in the rear surface 14 of the wiring board 11 is accurately guided to the pin ports 9 formed in the support portion 7. Thus, the wiring board 11 is supported while adhering to the contact surface 8 of the support portion 7.

In a solder bump forming step, the upper jig 3 moves downward so that the roughened face 6 thereof presses the top portion 43 of each first solder bump 41. As a result, the height of each top portion 43 becomes the same as that of the top portion 44 of each second solder bump 42. The top portion 43 of each first solder bump 41 is assuredly pressed down with a uniform pressure (0.07 kg/bump in this embodiment) whereby the first solder bump 41 is roughened as well as being flattened at the same time. Then, the wiring board 11 after the solder bump forming process is conveyed and lifted to the outside of the device with the movable jig 5.

Then, in a flux supply process, the flux 28 is supplied to the top portion 43 of each first solder bump 41 and the whole surface of each second solder bump 42. Typical methods for supplying the flux 28 include a method that applies a liquefied flux 28, a method that supplies a liquefied flux 28 by a dispenser, a foaming method that applies a foaming-type flux 28, a method that supplies a mist-type flux 28 by a spray or the like. In addition, a kind of flux 28 is not particularly limited, and a conventionally known flux can be employed.

Figure 9:
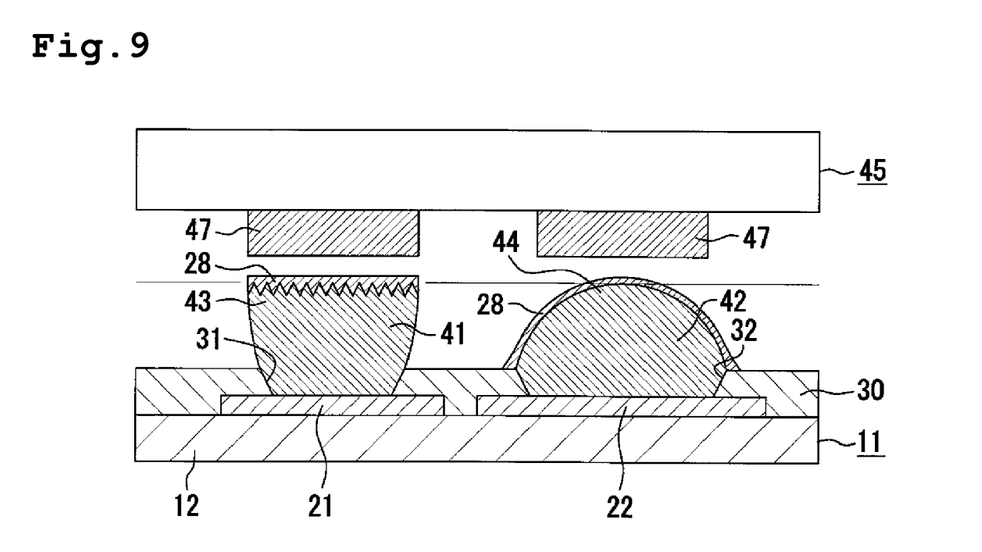
FIG. 9 is a side sectional view of a portion of a wiring board during a step of a method for manufacturing the wiring board.
Figure 10:
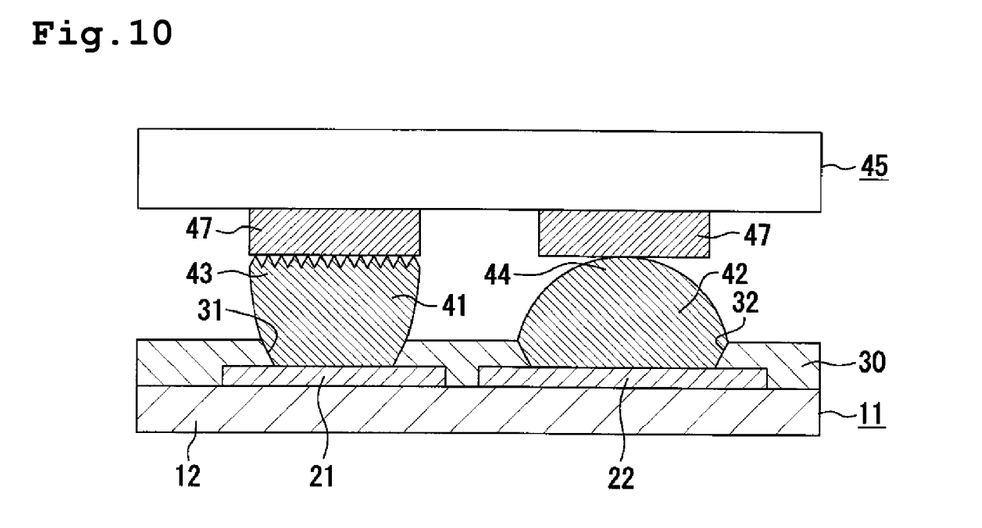
FIG. 10 is a side sectional view of a portion of a wiring board during a step of a method for manufacturing the wiring board.
Figure 11:
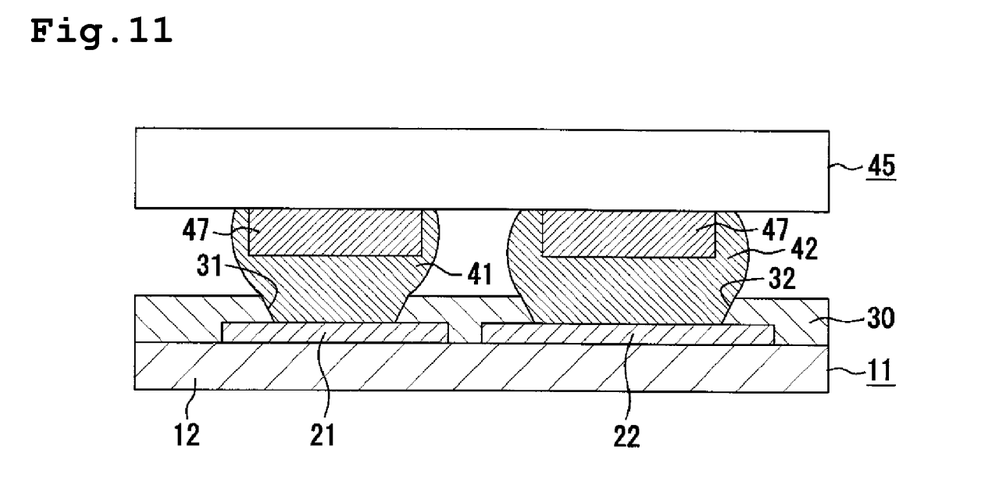
FIG. 11 is a side sectional view of a portion of a wiring board during a step of method for manufacturing the wiring board.

Furthermore, the plurality of contact terminals 47 disposed on a bottom face of the IC chip 45 are positioned so as to correspond to the flux-supplied solder bumps 41, 42, disposed on the top surface 13 of the wiring board 11 (refer to FIG. 9). In addition, the contact terminals 47 in this embodiment are conductors made of copper plating (copper post). The solder bumps 41, 42 are heated and melted (reflow) to vaporize the flux 28 and join each solder bump 41, 42 to each contact terminal 47 (refer to FIGS. 10 and 11). As a result, the IC chip 45 is mounted on the wiring board 11.

Therefore, the following effects can be obtained according to this embodiment.

(1) Since the diameter of the first opening 31 is smaller than that of the second opening 32 in the wiring board 11 of the embodiment, a portion of the first solder bump 41 which projects from the opening edge of the first opening 31 has a greater volume than that of a portion of the second solder bump 42 which projects from the opening edge of the second opening 32. As a result, since the height of the first solder bump 41 is higher than that of the second solder bump 42, variation in the height of the solder bumps 41, 42 is likely to occur. This variation may cause a faulty connection between the solder bumps 41, 42 and the IC chip 45.

Thus, the top portion 44 of the second solder bump 42 has a non-flat face in this embodiment. That is, the magnitude of flattening the first solder bump 41, which is higher in height, is greater than the magnitude of flattening the second solder bump 42, which has is lower in height. In this way, although the solder resist 30 has therein the plurality of openings 31, 32 with different diameters, the connection reliability between the solder bumps 41, 42 and the IC chip 45 can be improved because the height of each solder bump 41, 42 is aligned.

(2) According to the embodiment, the flat face of the top portion 43 is not uniform so that the flux 28 that facilitates good junction with the contact terminals 47 can retain on the top portion 43. Thus, the flux 28 facilitates the junction with the contact terminals 47, thereby improving the connection between the solder bumps 41, 42 and the contact terminals 47.

(3) According to the embodiment, although the pressure tends to concentrate on the supported area AR2 when the solder bumps are under pressure, the support portion 7 of the lower jig 4 can entirely support the area AR2. Thus, it is possible to prevent a bending of the wiring board 11. Further, the wiring board 11 with the solder bumps excellent in coplanarity can be assuredly and readily produced. Therefore, the upper jig 3 can assuredly press and flatten the plurality of first solder bumps 41 formed in the bump forming area AR1.

The embodiment of the present invention may be modified as follows.

Figure 12:
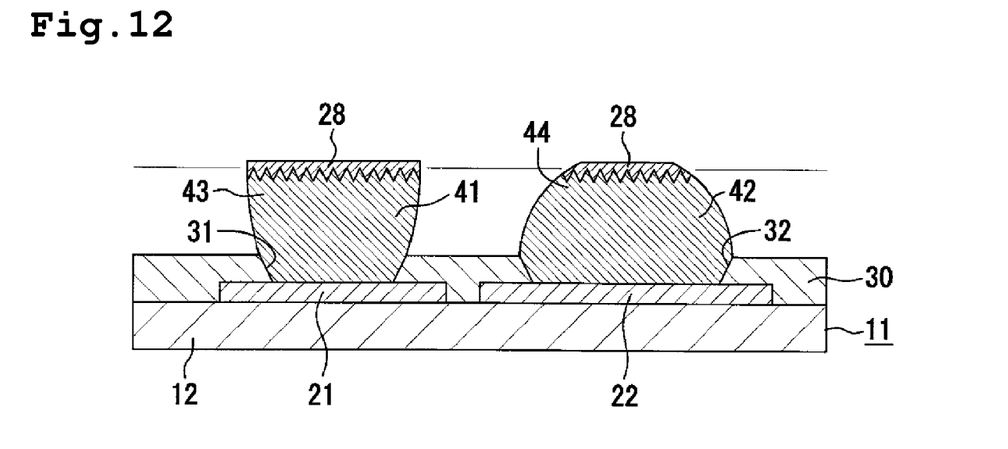
FIG. 12 is a side sectional view showing a portion of a wiring board after a solder bump forming step according to another embodiment of the invention.

Although the top portion 44 of the second solder bump 42 according to the embodiment does not have a flat face, it may include a flat face with an area smaller than that of the flat face of the top portion 43 of the first solder bump 41 as shown in FIG. 12.

Although the above-mentioned embodiment employs two types of openings each having different diameter—i.e., the first opening 31 and the second opening 32, three or more types of openings each having different diameter may be employed. In this case, the flat face area of the top portion of the solder bump disposed in the opening is enlarged as the diameter of the opening is reduced. In addition, the top portion of the solder bump disposed in the opening with the smallest diameter may or may not have a flat face.

According to the above-mentioned embodiment, the top portion 43 of the first solder bump 41 is flattened and roughened at the same time in the solder bump forming process. However, in the solder bump forming process, the top portion 43 may be flattened in a separate flattening step and be roughened in a separate roughening step.

In the embodiment, the upper jig 3 presses the top portions 43 of plural first solder bumps 41 to thereby flatten and roughen the top portion 43. However, the top portions 43 of plural first solder bumps 41 may be flattened and roughened by surface polishing. For example, the wiring board 11 having the plurality of solder bumps 41, 42 is mounted on a vacuum absorption board that includes many through holes and fixed by vacuum absorption with reducing an air pressure at a lower side of the vacuum absorption board. Next, the top portions 43 of plural first solder bumps 41 are collectively ground using a sanding device that has a rotational sand board, such as a grinder. More particularly, the rotational sand board with a roughness of #1000 is rotated at 120 rpm and moved downward at a speed of 0.2 mm/second. Thus, the top portions 43 of plural first solder bumps 41 are collectively ground, flattened and roughened. As an example of grinding methods, both dry and wet grinding may be employed.

The solder bumps 41, 42 of the embodiment are used for joining the wiring board 11 to the IC chip 45. However, the solder bumps 41, 42 may be used for joining, for example, the wiring board 11 to the motherboard.

DESCRIPTION OF REFERENCE NUMERALS

3: upper jig serving as a pressing tool
6: roughened face of a pressing tool
11: wiring board
12: wiring board main body
13: surface of a wiring board body
21: first pad serving as a metal layer
22: second pad serving as a metal layer
30: solder resist
31: first opening serving as an opening
32: second opening serving as an opening
41: first solder bump serving as a solder bump
42: second solder bump serving as a solder bump
43, 44: top portion
51: solder ball serving as a solder bump formation material

What is claimed is:
1. A wiring board comprising:
a wiring board main body having a top surface;
a metal layer formed on the top surface of the wiring board main body;
a solder resist formed at least on the metal layer and including therein a plurality of openings of different diameters in which the metal layer is exposed; and
a plurality of solder bumps disposed on the metal layer in the plurality of openings,
wherein the plurality of openings includes a first opening and a second opening having a diameter larger than that of the first opening, wherein a top portion of a solder bump disposed in the first opening has a flat and rough face, wherein a top portion of a solder bump disposed in the second opening has a flat and rough face with an area smaller than that of the flat face of the top portion of the solder bump disposed in the first opening, wherein the metal layer exposed in the first opening and the solder bump disposed in the first opening constitute an electrical signal path, and the metal layer exposed in the second opening and the solder bump disposed in the second opening constitute an electrical ground path or an electrical power source path, wherein the electrical signal path and the electrical ground path or the electrical power source path are electrically independent, wherein a volume of the solder bump disposed in the first opening is equal to that of the solder bump disposed in the second opening, and wherein a coplanarity measurement of the top portion of the solder bump disposed in the first opening is 10 micrometers or less per 1 cm$^2$.

2. A wiring board according to claim 1, wherein the top portion of the solder bump disposed in the first opening has a surface roughness Ra of between 0.3 micrometers and 5 micrometers or less.

3. A wiring board comprising:

a wiring board main body having a top surface;

a metal layer formed on the top surface of the wiring board main body;

a solder resist formed at least on the metal layer and including therein a plurality of openings of different diameters in which the metal layer is exposed; and a plurality of solder bumps disposed on the metal layer in the plurality of openings, wherein the metal layer exposed in a first opening of the plurality of openings and the solder bump disposed in the first opening constitute an electrical signal path, and the metal layer exposed in a second opening of the plurality of openings and the solder bump disposed in the second opening constitute an electrical ground path or an electrical power source path, wherein the electrical signal path and the electrical ground path or the electrical power source path are electrically independent, wherein a top portion of the solder bump disposed in the first opening has a flat and rough face, and a top portion of the solder bump disposed in the second opening has a flat and rough face, wherein an area of the flat and rough face of the solder bump disposed in the first opening and an area of the flat and rough face of the solder bump disposed in the second opening are enlarged as the diameter of the respective openings are reduced, wherein a volume of the solder bump disposed in the first opening is equal to that of the solder bump disposed in the second opening, and wherein a coplanarity measurement of the top portion of the solder bump disposed in the first opening is 10 micrometers or less per 1 cm$^2$.

4. A wiring board according to claim 3, wherein the top portion of the solder bump disposed in the first opening has a surface roughness Ra of between 0.3 micrometers and 5 micrometers.

* * * * *